United States Patent
Wissel et al.

Patent Number: 5,118,972
Date of Patent: Jun. 2, 1992

[54] BICMOS GATE PULL-DOWN CIRCUIT

[75] Inventors: Larry Wissel, Williston; Terrance J. Zittritsch, Colchester, both of Vt.

[73] Assignee: International Business Machines Corporation, Armonk, N.Y.

[21] Appl. No.: 714,481

[22] Filed: Jun. 13, 1991

[51] Int. Cl.⁵ .................. H03K 19/02; H03K 3/33
[52] U.S. Cl. .................. 307/446; 307/570; 307/300; 307/443
[58] Field of Search .......... 307/446, 570, 300, 451, 307/443

[56] References Cited

U.S. PATENT DOCUMENTS

| | | | |
|---|---|---|---|
| 4,616,146 | 10/1986 | Lee et al. | 307/446 |
| 4,719,373 | 1/1988 | Masuda et al. | 307/300 |
| 4,813,020 | 3/1989 | Iwamura et al. | 307/570 |
| 4,910,416 | 3/1990 | Salcone | 307/300 |
| 4,926,069 | 5/1990 | Yamazaki | 307/570 |
| 4,970,414 | 11/1990 | Ruth, Jr. | 307/570 |
| 5,001,365 | 3/1991 | Murabayashi et al. | 307/446 |
| 5,027,009 | 6/1991 | Urakawa | 307/570 |

Primary Examiner—David Hudspeth
Assistant Examiner—Andrew Sanders
Attorney, Agent, or Firm—Heslin & Rothenberg

[57] ABSTRACT

BiCMOS gate pull-down circuits are disclosed for enhanced downside switching of load capacitance. Two PFETs are connected in series as input to the base of an npn type bipolar transistor. The collector and emitter of the bipolar transistor are connected to the circuit output and ground, respectively. One of the series connected PFETs is gated by a predetermined input signal and the second PFET is controlled by the output of an inverter tied to the collector of the bipolar transistor. Upon saturation of the bipolar transistor, the inverter disrupts flow of charge into the base of the transistor and an NFET tied between the base and ground begins to pull charge from the base. A second NFET may be connected to dissipate charge from the collector either through the base or directly to ground. Various circuit modifications are also discussed.

15 Claims, 2 Drawing Sheets fig. 2

BICMOS GATE PULL-DOWN CIRCUIT

BACKGROUND OF THE INVENTION

1. Technical Field

This invention relates in general to gate circuits, and more particularly, to a gate circuit formed of a combination of metal-oxide-semiconductor field-effect transistors and bipolar transistors (herein BiCMOS gate circuit) for fast switching of large loads.

2. Description of the Prior Art

Numerous BiCMOS gate circuits are available in the open literature. These circuits generally seek to achieve high speed operation with low power consumption. By way of example, reference is made to the circuits disclosed in U.S. Pat. No. 4,829,201, entitled "Gate Circuit of Combined Field-Effect and Bipolar Transistors," and IEEE International Solid-State Circuits Conference article entitled "High-Speed Digital BiCMOS ICs." Any enhancements to the speed of operation and/or power consumption characteristics of such circuits are considered significant in BiCMOS gate circuit technology.

As a state-of-the-art type example, a typical BiCMOS NAND pull-up/pull-down gate circuit 11 is depicted in FIG. 1. As depicted, BiCMOS NAND circuit 11 includes a pull-down circuit 10 and a pull-up circuit 12. Once activated, pull-up circuit 12 functions to provide a sharp pull-up transition on a load, while conversely pull-down circuit 10 functions to provide a sharp pull-down transition on the load once the pull-up circuit becomes inactive. Numerous alternate circuit embodiments for both pull-down circuit 10 and pull-up circuit 12 are available in the open literature. Since the present invention relates to the pull-down function, a detailed description of only the pull-down portion of this conventional BiCMOS gate circuit configuration is provided.

Circuit 10 includes a bipolar transistor $Q_1$ having a collector "C" connected to the output of BiCMOS NAND circuit 11, and n series connected n-channel metal-oxide-semiconductor field-effect transistors (hereinafter NFETs) $T_0, \ldots T_n$ connected between the collector "C" and base "B" of transistor $Q_1$. Circuit inputs $A_0 \ldots A_n$ are each respectively fed to the gate "G" of one of the NFETs $T_0 \ldots T_n$. NFETs $T_0 \ldots T_n$ are serially connected such that the drain "D" of the first NFET $T_0$ is connected to the collector "C" of transistor $Q_1$ and the source "S" of the nth NFET $T_n$ is connected to the base "B" of transistor $Q_1$. Transistor $Q_1$ comprises an npn type transistor with its emitter "E" connected to ground. A bleeder resistor "R", connected between base "B" of transistor $Q_1$ and ground, is provided for discharging charge from base "B" when transistor $Q_1$ is switched to an off state from an on state. In the NAND gate configuration shown, when inputs $A_0 \ldots A_n$ are high, NFETs $T_0 \ldots T_n$ are all in an on state and a base current (from load capacitance) begins to flow.

Transistor $Q_1$ amplifies this base current, and thereby quickly discharges the output capacitance through collector "C" to emitter "E" and hence ground.

Theoretically, base "B" will rise to a diode drop, i.e., 0.7 volts, thereby turning transistor $Q_1$ on strongly. NFETs $T_0 \ldots T_n$ will conduct until collector "C" falls to 0.7 volts. At that time, the drain to source voltage $V_{DS}$ across NFETs $T_0 \ldots T_n$ will be zero and no more current will flow in the circuit. Saturation of transistor $Q_1$ is therefore avoided by design because collector "C" voltage cannot go lower than base "B" voltage.

In practice, however, peak voltage at base "B" may actually rise to 1.4 volts instead of the "textbook" value of 0.7 volts. A number of factors can combine to produce such an increased base voltage. For example, current densities in BiCMOS gate devices are very high, meaning that the actual junction turn on voltage is in practice slightly greater than 0.7 volts. Further, internal parasitic resistances in series with the emitter and base combine to further limit performance of the circuit. Parasitic resistances can contribute up to 0.5 volts to transistor $Q_1$ turn on voltage.

A high base "B" voltage detracts directly from the voltage between gate and source $V_{GS}$ of NFETs $T_0 \ldots T_n$, thereby reducing the conductance of the NFET stack. A lower conductance reduces base "B" rise time, which produces a slower pull-down circuit. The loss of NFET stack conductance becomes more significant when the voltage $V_{CC}$ (not shown) applied across the BiCMOS gate circuit is reduced. The voltages input $A_0 \ldots A_n$ at the gates of the NFET stack are from previous logic stages, and a high voltage of a previous stage will necessarily track $V_{CC}$, i.e., the power supply across the entire circuit, which in turn effects the gate to source voltage $V_{GS}$ across NFETs $T_0 \ldots T_n$. Further, performance can be effected by increasing the number of FETs in the stack. The more devices in series (e.g., for an AND or NAND gate), the worse the conductance of the field-effect transistor stack and, therefore, the performance of the pull-down circuit.

Thus, an enhanced BiCMOS gate pull-down circuit achieving higher speed operation with lower power consumption than presently available BiCMOS gate circuits is believed desirable and of significant value to the industry.

SUMMARY OF THE PRESENT INVENTION

Briefly summarized, a novel bipolar transistor-field-effect transistor gate pull-down circuit for pulling down a signal on an output line of the gate circuit is provided. In a basic embodiment, the pull-down circuit includes a bipolar transistor having a collector of a first conductivity type connected to the output line, an emitter of the first conductivity type connected to a first potential, and a base of a second conductivity type. An input circuit, which drives the bipolar transistor, includes at least one field-effect transistor of the second conductivity type which is connected between the base of the bipolar transistor and a second potential. The second potential is different from the first potential. The input circuit is responsive to a predetermined input and outputs a signal to the base of the bipolar transistor for rendering the bipolar transistor in an on or off state. The input circuit continues to provide charge to the base of the bipolar transistor while signaling the bipolar transistor for the on state. Detection means are provided for detecting saturation of the bipolar transistor and interrupt circuit means is connected to the detection means and to the input circuit for eliminating the source of charge to the base of the bipolar transistor upon detection of transistor saturation. Finally, discharge means removes charge from the base of the bipolar transistor after detection of transistor saturation by the detection means.

In a more specific invention embodiment, the input circuit can include two serially connected field-effect transistors of the second conductivity type. One of the series connected transistors is connected to the second potential, and the other of the two transistors is connected to the base of the bipolar transistor. Further, the bipolar transistor may comprise an npn type transistor and the field-effect transistors of the second conductivity type may comprise p-channel metal-oxide-semiconductor field-effect transistors (hereinafter PFETs). In such a case, the first potential is ground and the second potential comprises the gate circuit power voltage. Specific circuitry for the detection means, interrupt circuit means and discharge means, along with other circuit enhancements are also depicted and claimed herein.

As summarized, an improved BiCMOS gate pull-down circuit is provided by the present invention. The pull-down circuit can be connected, for example, to conventional AND, NAND, OR, NOR or inverter CMOS logic to provide good downside switching performance. Further, good performance is advantageously maintained by this pull-down circuit notwithstanding a lowering of the circuit power supply. Finally, the BiCMOS pull-down circuit described herein obviates certain identified disadvantages inherent in conventional BiCMOS digital switching circuits designed to perform the same function.

BRIEF DESCRIPTION OF THE DRAWINGS

These and other objects, advantageous and features of the present invention will be more readily understood from the following detailed description of a certain preferred embodiment thereof, when considered in conjunction with the accompanying drawings in which:

FIG. 2 is a schematic of a BiCMOS NAND gate circuit in accordance with the present invention.

DETAILED DESCRIPTION OF A PREFERRED EMBODIMENT

Figure 2:
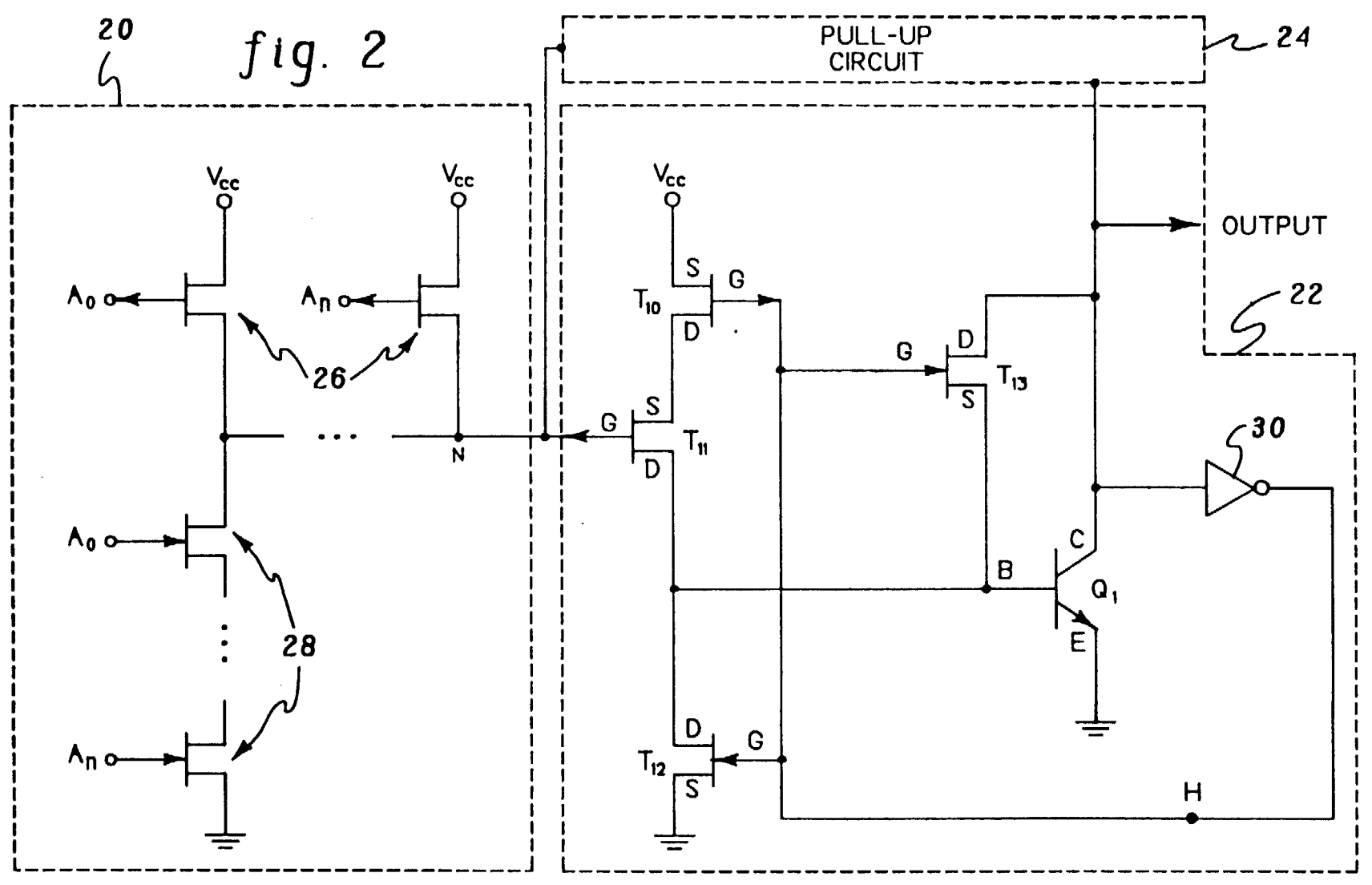
Figure 1:
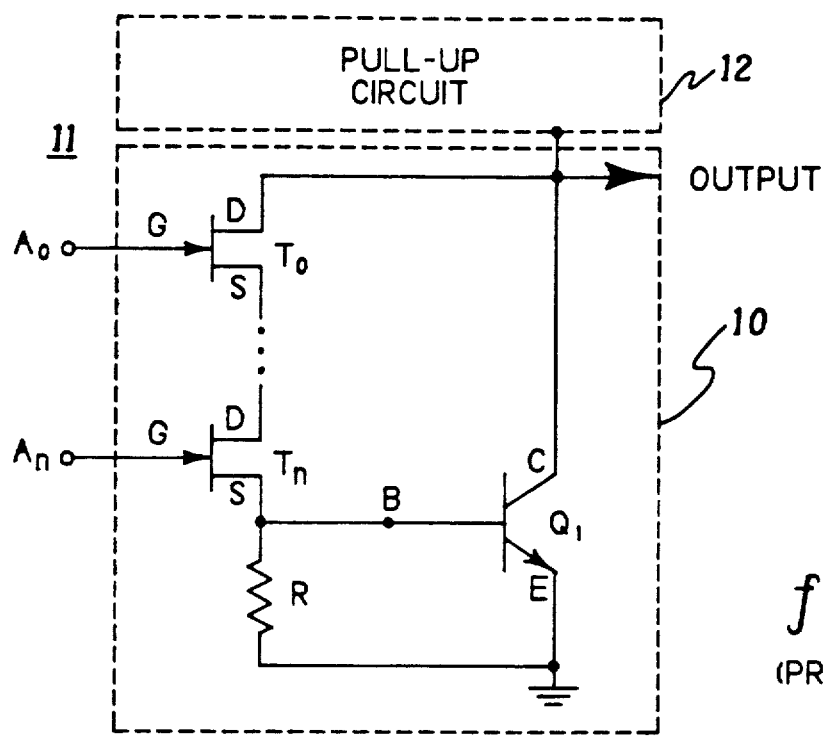
FIG. 1 is a schematic of a prior art BiCMOS NAND gate circuit.

Conceptually, the circuit of the present invention avoids the identified prior art BiCMOS gate circuit switching problems by making the gate to source voltage of the field-effect transistors (FETs) in the circuit independent of any change in voltage at node "B" of the bipolar transistor. (The same reference letters are used throughout the different figures to designate the same or similar components.) By way of example, a common CMOS NAND gate 20 is depicted in FIG. 2 in combination with an output pull-down circuit 22 pursuant to the present invention. Pull-down circuit 22 can be common to a number of different input logic functions such as AND, NAND, OR and NOR CMOS gates, all of which are well known in the art. Those skilled in the art will also recognize that NAND gate 20 is configured to drive pull-up circuit 24, along with pull-down circuit 22. Again, pull-up circuit 24 can comprise any one of the numerous such circuits available in the open literature. (For example, an emitter follower transistor could be used in which the emitter is tied to the circuit output, the collector to circuit power $V_{CC}$, and the base to the drive input (node "N").)

In the conventional NAND gate drive circuit 20, multiple p-channel metal-oxide-semiconductor field-effect transistors (PFETs) 26 are connected in parallel, with each PFET 26 having a separate gate circuit input $A_0 \ldots A_n$. PFET 26 sources are connected to circuit power supply $V_{CC}$ and their drains are connected to a common output node "N". Also receiving gate inputs $A_0 \ldots A_n$ are the gate contacts of n series connected NFETs 28. NFET stack 28 is connected between node "N" and ground. Node "N" is connected to both pull-up circuit 24 and pull-down circuit 22 as shown.

Pull-down circuit 22 includes a conventional bipolar transistor $Q_1$ having a collector "C", base "B" and emitter "E". In this example, transistor $Q_1$ comprises an npn type transistor wherein emitter "E" is tied to ground. As in the prior art embodiment, collector "C" is tied to the output load. Base "B" is driven by a PFET stack in common-source mode. The stack includes a first PFET $T_{10}$ and a second PFET $T_{11}$. The source "S" of transistor $T_{10}$ is connected to circuit supply voltage $V_{CC}$ and the gate "G" is connected to collector "C" of transistor $Q_1$ through an inverter circuit 30. Drain "D" of PFET $T_{10}$ is tied to the source "S" of PFET $T_{11}$. Gate "G" of transistor $T_{11}$ is connected to receive a predetermined input signal, such as the control signal output from CMOS NAND circuit 20 at node "N". Drain "D" of PFET $T_{11}$ is connected to base "B" of bipolar transistor $Q_1$. The output of inverter 30, i.e., the value at node "H" is also fed to the gate controls of two NFETs $T_{12}$ and $T_{13}$. The source "S" of NFET $T_{12}$ is connected to ground while the drain "D" is tied to base "B" for removing charge therefrom as described further below. Similarly, the drain of NFET $T_{13}$ is connected to the collector "C" of transistor $Q_1$ and its source to base "B".

For the NAND gate example depicted, when inputs $A_0 \ldots A_n$ switch high (i.e., in the pull-down mode), the voltage at node "N" falls quickly. As voltage at node "N" drops, PFET $T_{11}$ begins to conduct current to base "B" of transistor $Q_1$. Since the voltage at collector "C" of transistor $Q_1$ is initially high in this scenario, the output of inverter 30 is low, thereby coupling $V_{CC}$ to base "B" through PFETs $T_{10}$ and $T_{11}$. It should be observed that in this configuration, the gate to source voltage $V_{GS}$ of PFET $T_{11}$ is advantageously independent of any voltage change at node "B". As voltage at base "B" rises, $V_{GS}$ of transistor $T_{11}$ remains unchanged. Therefore, PFET current to node "B" will not significantly degrade as base voltage rises.

Once bipolar transistor $Q_1$ has been activated, voltage at collector "C" $V_C$ will drop and continue to drop even after $V_C$ has reached the voltage at base "B" $V_B$, resulting in saturation of transistor $Q_1$. PFETs $T_{10}$ & $T_{11}$ continue to supply charge to base "B" even after collector voltage $V_C$ has dropped below base voltage $V_B$. In accordance with the present invention, detection circuitry for indirectly identifying transistor saturation is provided. This circuitry includes inverter circuit 30 which is tied to the gate contacts of PFET $T_{10}$ and NFETs $T_{12}$ & $T_{13}$. When the voltage at collector "C" drops to a predetermined low level, a high signal is output from inverter 30 which is applied to the gates "G" of PFET $T_{10}$ and NFETs $T_{12}$ and $T_{13}$. A high gate "G" signal at PFET $T_{10}$ results in an interruption in charge flow from $V_{CC}$ to base "B" therethrough. In addition, a high signal at the gate of NFET $T_{12}$ allows charge from base "B" to begin draining to ground. Excess charge at collector "C" is removed to base "B" and hence ground through NFET $T_{13}$, which again is activated with receipt of a high signal at its gate. (As an alternate embodiment, the source "S" of NFET T₁₃ could be connected directly to ground, which would allow direct draining of charge to ground from the collector "C" upon activation of NFET T₁₃.)

As noted above with respect to FIG. 2, NFETs 28 have a gate to source voltage $V_{GS}$ which is independent of bipolar transistor $Q_1$. This is in contrast to the prior art embodiment of FIG. 1. Further, NFETs 28 drive only the gate control "G" of PFET T₁₁, rather than the base "B" of npn transistor $Q_1$ (which obviously requires substantial current). Further, once conducting, the parasitic resistances inherent in transistor $Q_1$ do not significantly effect the conductance of PFETs T₁₀ and T₁₁. In the circuit embodiment depicted, the voltage at base "B" may even rise above 1.4 volts and transistor $Q_1$ will continue to conduct to pull the voltage at collector "C" low. The NFET (large) and PFET (small) of a CMOS inverter circuit embodiment would be scaled such that voltage at node "H" does not rise until after voltage at collector "C" crosses the switching threshold of subsequent circuits (not shown). By the time the voltage at node "H" rises, transistor $Q_1$ base current is no longer needed and the priority is to bring transistor $Q_1$ back out of saturation as quickly as possible. Limitation of this "recovery time" is accomplished by simultaneously turning PFET T₁₀ off and beginning to pull the voltage at base "B" low by removing charge through NFET T₁₂. NFET T₁₃ equalizes the voltage at nodes "B" and "C". As a practical example, the anticipated duration of transistor $Q_1$ saturation is less than 0.4 nanoseconds from simulations conducted.

Figure 3:
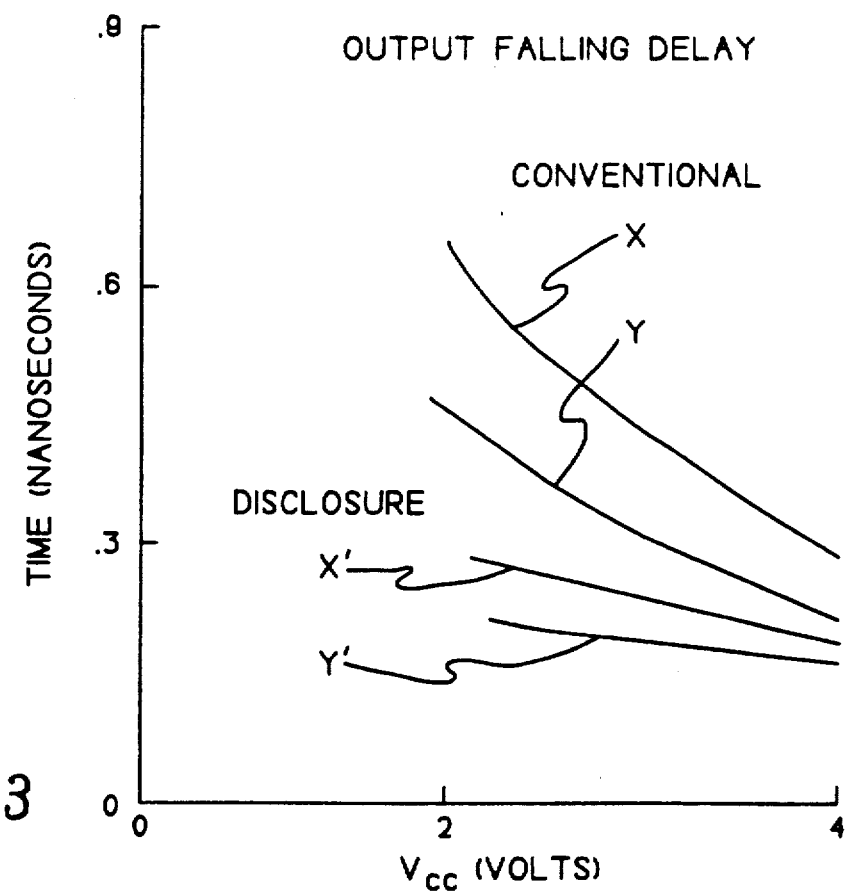
FIG. 3 is a graphical depiction of output falling delays for a conventional 4-NAND BiCMOS gate and a conventional 2-NAND BiCMOS gate in comparison with a 4-NAND BiCMOS gate and a 2-NAND BiCMOS gate constructed in accordance with the present invention.

FIG. 3 depicts a graphical comparison of "Output Falling Delay" times versus $V_{CC}$ operating voltage for a conventional 4-NAND BiCMOS gate (X), a conventional 2-NAND BiCMOS gate (Y), and a 4-NAND BiCMOS gate constructed in accordance with the present invention (X'), and a 2-NAND BiCMOS gate constructed in accordance with the present invention (Y'). As shown, both of the conventional NAND BiCMOS gates require significantly greater switching time to pull-down a load capacitance as circuit supply voltage $V_{CC}$ drops (e.g., from four to three volts) than do the NAND BiCMOS gates fabricated pursuant to the present invention.

It will be noted from the above description that an improved BiCMOS gate pull-down circuit is provided. The pull-down circuit can be connected to any one of numerous conventional CMOS logic circuits to provide enhanced downside switching performance. Further, this high performance can be maintained notwithstanding reduction in the circuit power supply. In addition, the BiCMOS pull-down circuit described herein eliminates certain identified disadvantages inherent in conventional digital switching circuit performance.

Although a specific embodiment of the present invention has been illustrated in the accompanying drawings and described in the foregoing detailed description, it will be understood that the invention is not limited to the particular embodiment described herein, but is capable of numerous rearrangements, modifications, and substitutions without departing from the scope of the invention. For example, complementary circuits to those described herein could be constructed in accordance with the present invention. The following claims are intended to encompass all such modifications.

What is claimed is:

1. A bipolar transistor-field effect transistor gate pull-down circuit for pulling down a signal on an output line of the gate circuit, said pull-down circuit comprising:
   a bipolar transistor having a collector of a first conductivity type connected to said output line, an emitter of the first conductivity type connected to a first potential, and a base of a second conductivity type;
   an input circuit including:
      at least one field-effect transistor of the second conductivity type, said at least one field-effect transistor of the second conductivity type being coupled between the base of said bipolar transistor and a second potential, said second potential being different from said first potential,
      said input circuit being responsive to a predetermined input to output a signal to the base of said bipolar transistor for rendering said bipolar transistor in an on or off state, said input circuit continuing to provide charge to the base of said bipolar transistor when rendering said bipolar transistor in the on state;
   detection means for detecting saturation of said bipolar transistor when in the on state;
   interrupt circuit means connected to said detection means and said input circuit for eliminating the source of charge to the base of said bipolar transistor upon detection of transistor saturation by said detection means; and
   discharge means for removing charge from the base of said bipolar transistor upon detection of transistor saturation by said detection means.

2. The pull-down circuit according to claim 1, wherein said input circuit includes two series connected field-effect transistors of the second conductivity type, one of said two series connected transistors being connected to said second potential, and the other of said two series connected transistors being connected to the base of said bipolar transistor.

3. The pull-down circuit according to claim 2, wherein said bipolar transistor comprises an npn type transistor and said field-effect transistors of the second conductivity type comprise PFETs.

4. The pull-down circuit according to claim 3, wherein said first potential comprises ground potential and said second potential comprises a gate circuit power supply.

5. The pull-down circuit according to claim 3, wherein a first one of said two series connected PFETs has its source connected to said second potential, its gate connected to the output of said inverter, and its drain tied to the source of the second one of said two series connected PFETs, the gate control of said second series connected PFET being connected to receive said predetermined input and the drain of said second series connected PFET being connected to the base of said bipolar transistor.

6. The pull-down circuit according to claim 2, wherein said one of said two series connected field-effect transistors of the second conductivity type connected to the base of said bipolar transistor is gated by said predetermined input to said input circuit and wherein said interrupt circuit means includes an electrical connection to the gate of said other of said two series connected first field-effect transistors connected to said second potential.

7. The pull-down circuit according to claim 1, wherein said detection means includes an inverter circuit having an input connected to the collector of said bipolar transistor, said inverter circuit being configured such that its output changes with saturation of said bipolar transistor.

8. The pull-down circuit according to claim 7, wherein said discharge means includes a first field-effect transistor of the first conductivity type, said first field-effect transistor of the first conductivity type being connected between the base of said bipolar transistor and said first potential.

9. The pull-down circuit according to claim 8, wherein the output of said inverter circuit gates said first field-effect transistor of the first conductivity type such that said first conductivity type transistor is rendered on when said bipolar transistor saturates, thereby allowing discharge of excess charge from the base of said bipolar transistor.

10. The pull-down circuit according to claim 9, wherein said discharge means further includes means for removing charge from the collector of said bipolar transistor upon detection of transistor saturation by said detection means.

11. The pull-down circuit according to claim 10, wherein said means for removing charge from the collector of said bipolar transistor comprises a second field-effect transistor of the first conductivity type connected between the base and the collector of said bipolar transistor, the gate of said second field-effect transistor of the first conductivity type being tied to the output of said inverter such that said second field-effect transistor of the first conductivity type is rendered on for discharging excess charge at the collector when said bipolar transistor is in saturation.

12. The pull-down circuit according to claim 10, wherein said discharge means includes a second field-effect transistor of the first conductivity type connected between the collector of said bipolar transistor and the base of said bipolar transistor, the gate of said second field-effect transistor of the first conductivity type being connected to the output of said inverter such that said second field-effect transistor of the first conductivity type is rendered on to discharge excess charge at the collector when said bipolar transistor is in saturation.

13. The pull-down circuit according to claim 1, further comprising means for generating said predetermined input to said bipolar transistor input circuit, said generating means being responsive to at least one gate circuit input signal.

14. The pull-down circuit according to claim 13, wherein said generating means implements AND, NAND, OR, NOR, or inverter logic circuitry.

15. The pull-down circuit according to claim 14, wherein said generating means comprises a CMOS integrated circuit.

* * * * *